United States Patent
Sonoda et al.

(10) Patent No.: US 10,510,989 B2
(45) Date of Patent: Dec. 17, 2019

(54) ELECTROLUMINESCENT DEVICE

(71) Applicant: Sharp Kabushiki Kaisha, Sakai, Osaka (JP)

(72) Inventors: Tohru Sonoda, Sakai (JP); Takeshi Hirase, Sakai (JP); Tetsuya Okamoto, Sakai (JP); Tohru Senoo, Sakai (JP); Mamoru Ishida, Sakai (JP); Takashi Ochi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/742,890

(22) PCT Filed: Jul. 4, 2016

(86) PCT No.: PCT/JP2016/069738
§ 371 (c)(1),
(2) Date: Jan. 9, 2018

(87) PCT Pub. No.: WO2017/010329
PCT Pub. Date: Jan. 19, 2017

(65) Prior Publication Data
US 2018/0375056 A1    Dec. 27, 2018

(30) Foreign Application Priority Data
Jul. 10, 2015 (JP) .................. 2015-139059

(51) Int. Cl.
*H01L 51/52* (2006.01)
*G06F 3/041* (2006.01)
(Continued)

(52) U.S. Cl.
CPC ............ *H01L 51/529* (2013.01); *G06F 3/041* (2013.01); *G06F 3/0412* (2013.01);
(Continued)

(58) Field of Classification Search
CPC .............. H01L 51/529; H01L 27/3244; H01L 51/5253; H01L 27/3216; H01L 27/323;
(Continued)

(56) References Cited

U.S. PATENT DOCUMENTS 9,276,055 B1 *  3/2016  Son ................... H01L 27/3276
9,287,329 B1 *  3/2016  Lee .................. H01L 51/0097
(Continued)

FOREIGN PATENT DOCUMENTS

CN      101409320 A      4/2009
CN      104241316 A      12/2014
(Continued)

*Primary Examiner* — Kevin Quarterman
(74) *Attorney, Agent, or Firm* — Keating & Bennett, LLP (57) ABSTRACT

An organic EL display device includes a flexible base and an organic EL element (electroluminescent element) provided on the base, and further includes an adjustment layer that has heat dissipating properties and that adjusts a neutral surface of the organic EL display device. The adjustment layer is provided on the organic EL element side relative to the center of the whole organic EL display device in the film thickness direction.

12 Claims, 9 Drawing Sheets

(51) Int. Cl.
*H01L 27/32* (2006.01)
*H01L 51/00* (2006.01)

(52) U.S. Cl.
CPC ........ *H01L 27/323* (2013.01); *H01L 27/3216* (2013.01); *H01L 27/3244* (2013.01); *H01L 51/0045* (2013.01); *H01L 51/0097* (2013.01); *H01L 51/5253* (2013.01); *G06F 2203/04102* (2013.01); *H01L 51/5275* (2013.01); *H01L 2251/5338* (2013.01)

(58) Field of Classification Search
CPC ... H01L 51/0097; H01L 51/50; G06F 3/0412; G06F 3/041; G06F 2203/04102
See application file for complete search history.

(56) References Cited

U.S. PATENT DOCUMENTS

| | | |
|---|---|---|
| 2009/0090926 A1 | 4/2009 | Wang et al. |
| 2011/0175102 A1 | 7/2011 | Hatano |
| 2014/0192495 A1 | 7/2014 | Yajima |
| 2014/0367644 A1 | 12/2014 | Song et al. |
| 2015/0179722 A1 | 6/2015 | Koo et al. |
| 2015/0185782 A1 | 7/2015 | Kim et al. |
| 2015/0207095 A1* | 7/2015 | Mun .................. H01L 51/5256 257/40 |
| 2015/0317015 A1* | 11/2015 | Eguchi .................. G06F 3/044 345/174 |
| 2016/0066409 A1* | 3/2016 | Kwon .................. H05K 1/028 174/254 |
| 2016/0066411 A1* | 3/2016 | Hong .................. H05K 1/028 174/254 |

FOREIGN PATENT DOCUMENTS

| | | |
|---|---|---|
| JP | 2011-091129 A | 5/2011 |
| JP | 2011-171288 A | 9/2011 |
| JP | 2014-134653 A | 7/2014 |
| JP | 2014-200921 A | 10/2014 |

* cited by examiner

ELECTROLUMINESCENT DEVICE

TECHNICAL FIELD

The present invention relates to an electroluminescent device including an EL (electroluminescent) element.

BACKGROUND ART

In recent years, flat panel displays are used in various commodity products and fields, and thus they are required to have a large size, high image quality and low power consumption.

Under the circumstances, organic EL display devices, which include an organic EL (electroluminescent) element that utilizes electro luminescence of an organic material, are attracting great attention as all-solid state flat panel displays that are excellent as having capability of low voltage operation, quick responsivity and light emission.

In an active matrix type organic EL display device, for example, a thin-film organic EL element is provided on a substrate having TFTs (thin-film transistors). The organic EL element includes an organic EL layer (including a light emitting layer) that is disposed between a pair of electrodes. The TFTs are connected to one of the pair of electrodes. A voltage is applied across the pair of electrodes so that the light emitting layer emits light, thereby displaying images.

In the above conventional organic EL display device, it is known that a sealing layer is formed on the organic EL element to prevent the degradation of the organic EL element due to moisture or oxygen.

Moreover, in the above conventional organic EL display device, it is known that a flexible base is used as a support substrate for supports an organic EL element to make the device repeatedly bendable.

In the above bendable organic EL display device, in order to protect an organic EL element and a sealing layer having low bendability, it is required to minimize a bending stress to be applied to the organic EL element and the sealing layer. Therefore, in the conventional bendable organic EL display device, generally the base is thick to adjust a neutral surface of the organic EL display device, thereby minimizing the bending stress.

However, in the above conventional organic EL display device, since the base is thick, heat from the organic EL element accumulates inside the device (e.g., base). This sometimes results in the dimensional difference between layers in the organic EL element and/or layers in the sealing layer inside the device due to difference in the thermal expansion coefficient. As a result, in the conventional organic EL display device, separation of films in the layers in the organic EL element and/or the layers in the sealing layer, or twist of the base occurs, and this damages the organic EL display device.

To cope with this, in the above conventional organic EL display device, as described in Patent Document 1 below for example, a plastic substrate is used as a base, a plurality of through holes are formed in the plastic substrate, and heat dissipating layers are filled into the through holes, thereby preventing local accumulation of heat from the organic EL element and controlling local temperature rise.

Also, in the conventional organic EL display device, as described in Patent Document 2 below for example, a metal substrate is used as the base, thereby improving heat dissipating properties and dissipating heat from the organic EL element efficiently.

PRIOR ART DOCUMENTS

Patent Documents

Patent Document 1: JP 2011-091129 A
Patent Document 2: JP 2011-171288 A

DISCLOSURE OF INVENTION

Problem to be Solved by the Invention

However, in the conventional organic EL display device described in the above Patent Document 1, since the through holes and the heat dissipating layers are partially provided in the plastic substrate, heat from the organic EL element accumulates in the other portions not provided with the heat dissipating layers. This results in the separation of films or the twist of the base and damages the organic EL display device.

Moreover, in the conventional organic EL display device, since the base is configured by uniting the plastic substrate and the heat dissipating layers, it is difficult to reduce the thickness of the base. Specifically, the base needs to be sufficiently thick to allow the heat dissipating layers to cover the plastic substrate and to make the base flat. Because of this, the conventional organic EL display device cannot adequately dissipate heat from the organic EL element to the outside from the heat dissipating layers, and the damages attributed to the heat from the organic EL element sometimes cannot be avoided. Moreover, in the conventional organic EL display device, since the base is thick, it is difficult to reduce the bending stress by adjusting the neutral surface, and this sometimes damages the organic EL element and the sealing layer.

Moreover, in the conventional organic EL display device described in the above Patent Document 2, since the base is a metal substrate, plastic deformation or metal fatigue occurs in the metal substrate when the organic EL display device is bent repeatedly. This sometimes makes it difficult to bend the device, or increases the bending stress and damages the organic EL element and the sealing layer. Moreover, in the conventional organic EL display device, it is necessary to provide an insulating layer between the organic EL element and the metal substrate to electrically insulate the organic EL element and the metal substrate (base). Because of this, in the conventional organic EL display device, heat from the organic EL element accumulates inside the insulating layer, and the damages attributed to the heat from the organic EL element sometimes cannot be avoided.

With the foregoing in mind, it is an object of the present invention to provide an electroluminescent device that can prevent heat from an electroluminescent element from accumulating inside the device while avoiding damages due to repetitive bending.

Means for Solving Problem

To achieve the above object, an electroluminescent device according to the present invention includes a flexible base and an electroluminescent element provided on the base. The electroluminescent device further includes an adjustment layer that has heat dissipating properties and that adjusts a neutral surface of the electroluminescent device. The adjustment layer is provided on the electroluminescent element side relative to the center of the whole electroluminescent device in a film thickness direction.

In the thus configured electroluminescent device, the adjustment layer is provided to adjust the neutral surface of the electroluminescent device. The adjustment layer has heat dissipating properties and is provided on the electroluminescent element side relative to the center of the whole electroluminescent device in the film thickness direction. Thereby, unlike the above conventional example, it is possible to prevent the heat from the electroluminescent element from accumulating inside the device while avoiding damages due to repetitive bending.

In the electroluminescent device, it is preferable that the adjustment layer has a heat conductivity within a range from 0.15 to 20 W/m·K.

In this case, the adjustment layer can dissipate heat from the electroluminescent element reliably and efficiently.

In the electroluminescent device, the adjustment layer may be made of a carbon material, or a material in which a carbon material is dispersed in an organic resin.

In this case, the adjustment layer is made of a material having a high Young's modulus, whereby the thickness of the adjustment layer is reduced, and the thickness of the electroluminescent device is reduced easily.

In the electroluminescent device, the carbon material of the adjustment layer may be graphite, graphene, carbon nanohorns, carbon nanofibers, or carbon nanotubes.

In this case, a material having high heat conductivity is used for the adjustment layer, whereby the adjustment layer can dissipate heat from the electroluminescent element more efficiently.

The electroluminescent device may further include a touch panel, wherein the adjustment layer and the touch panel are provided so that the base is interposed therebetween.

In this case, it is possible to easily configure an electroluminescent device with a touch panel having excellent bendability and heat dissipating properties.

The electroluminescent device may further include a counter substrate provided opposed to the base.

In this case, the electroluminescent device can be strengthened, and the sealing properties of the electroluminescent element can be enhanced easily.

In the electroluminescent device, the adjustment layer may be in close contact with the counter substrate.

In this case, the bendability of the electroluminescent device can be improved easily while improving the strength of the electroluminescent device and the sealing properties of the electroluminescent element.

In the electroluminescent device, the adjustment layer may be in close contact with the base.

In this case, heat from the electroluminescent element is directly diffused from the base to the adjustment layer, thereby being dissipated more efficiently.

The electroluminescent device may further include a plurality of supporters that can make point contact with the adjustment layer, and a holding plate that holds the supporters.

In this case, it is possible to improve the bendability of the electroluminescent device.

In the electroluminescent device, it is preferable that the supporters and the holding plate each have a heat conductivity within a range from 10 to 250 W/m·K.

In this case, the supporters and the holding plate can dissipate heat from the electroluminescent element reliably and efficiently.

In the electroluminescent device, the electroluminescent element may emit light from an opposite side of the base.

In this case, it is possible to configure a top emission type electroluminescent device having excellent bendability and heat dissipating properties.

In the electroluminescent device, the electroluminescent element may emit light from the base side.

In this case, it is possible to configure a bottom emission type electroluminescent device having excellent bendability and heat dissipating properties.

Effects of the Invention

According to the present invention, it is possible to provide an electroluminescent device that can prevent heat from an electroluminescent element from accumulating inside the device while avoiding damages due to repetitive bending.

DESCRIPTION OF THE INVENTION

Hereinafter, preferred embodiments of an electroluminescent device of the present invention will be described with reference to the drawings. In the following description, the present invention is applied to an organic EL display device. The size and size ratio of each of the constituent members in the drawings may not exactly represent those of the actual constituent members.

Embodiment 1

Figure 1:
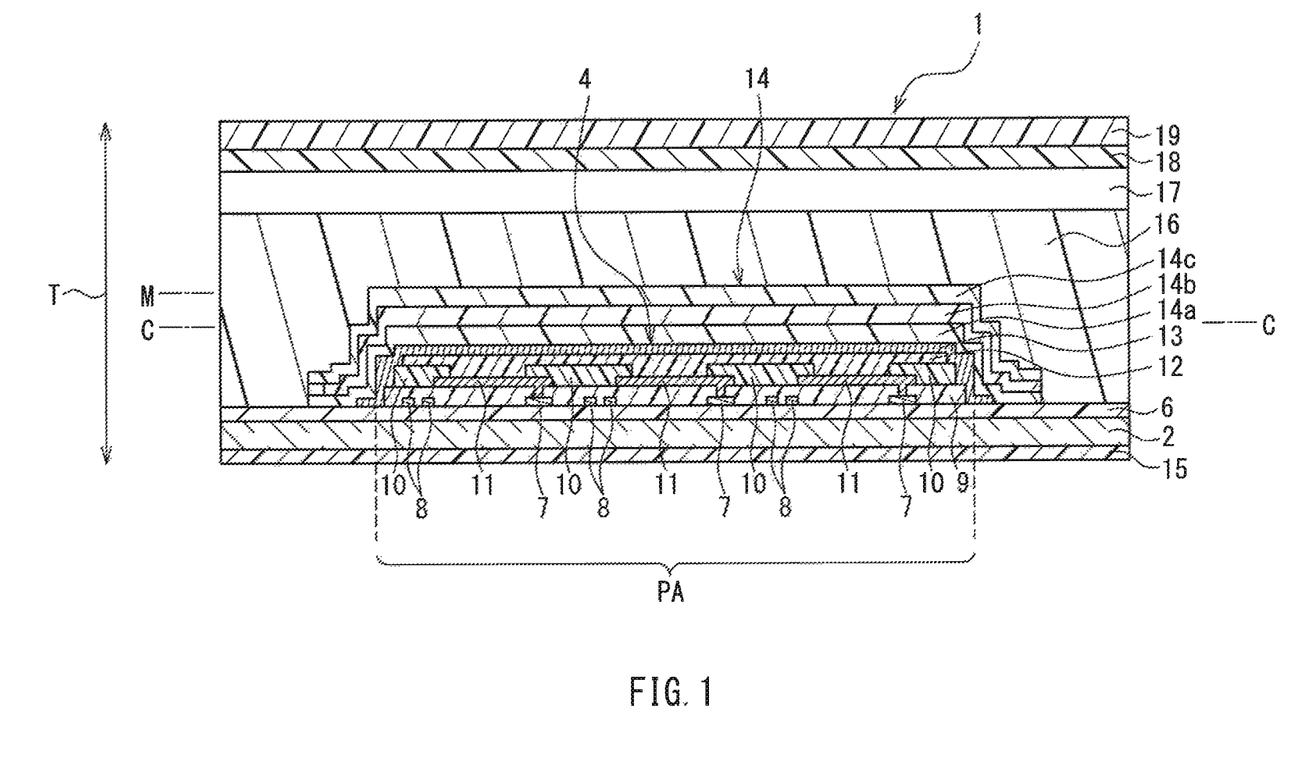
FIG. 1 is a cross-sectional view illustrating the cross section of an organic EL display device according to Embodiment 1 of the present invention.

FIG. 1 is a cross-sectional view illustrating the cross section of an organic EL display device according to Embodiment 1 of the present invention. In FIG. 1, an organic EL display device 1 of this embodiment includes a base 2 and an organic EL element (electroluminescent element) 4 provided on the base 2.

In the organic EL display device 1 of this embodiment, the organic EL element 4 forms a rectangular pixel region PA having a plurality of pixels (including a plurality of subpixels), and the organic EL element 4 is sealed by a sealing layer 14. The pixel region PA is a display portion of the organic EL display device 1 and displays information. In the pixel region PA, as detailed later, a plurality of pixels (a plurality of sub-pixels) are arranged in a matrix, and the pixel region PA displays information by light emission of the sub-pixels of the organic EL element 4.

In FIG. 1, the base 2 is made of, e.g., a plastic film having flexibility so that the organic EL display device 1 is repeatedly bendable. An underlying film (insulating film) 6 is formed on the base 2 to cover the entire surface of the base 2. As illustrated in FIG. 1, in the organic EL display device 1, TFTs (thin film transistors) 7 are provided on the underlying film 6 so as to correspond to respective sub-pixels in the pixel region PA. Moreover, lines 8 are formed on the underlying film 6. The lines 8 include a plurality of source lines (signal lines) and a plurality of gate lines that are arranged in a matrix. The source lines are connected to a source driver (not illustrated) and the gate lines are connected to a gate driver (not illustrated). With this configuration, the TFTs 7 are driven on a sub-pixel basis in accordance with an externally input image signal. The TFTs 7 function as switching elements that control the light emission of the corresponding sub-pixels. Thus, the TFTs 7 control the light emission of any of red (R), green (G), and blue (B) sub-pixels of the organic EL element 4.

The underlying film 6 prevents the properties of the TFTs 7 from being reduced due to the diffusion of impurities from the base 2 to the TFTs 7. If there is no concern for such a reduction in the properties of the TFTs 7, then the formation of the underlying film 6 may be omitted.

Further, in the organic EL display device 1 of this embodiment, a moisture barrier layer (not illustrated) is formed on the underlying film 6 under the TFTs 7. The moisture barrier layer is constituted by an inorganic film such as silicon nitride or silicon oxynitride and prevents the degradation of the TFTs 7 and the organic EL element 4 due to permeation (entering) of moisture or oxygen from the outside from the base 2 side.

As illustrated in FIG. 1, an interlayer insulating film 9, an edge cover 10, and a first electrode 11 of the organic EL element 4 are formed on the base 2. The interlayer insulating film 9 functions as a planarization film and is formed on the underlying film 6 (on which the moisture barrier layer is formed) to cover the TFTs 7 and the lines 8. The edge cover 10 is formed on the interlayer insulating film 9 to cover the pattern edges of the first electrode 11. The edge cover 10 also functions as an insulating layer to prevent a short circuit between the first electrode 11 and a second electrode 13 (described later). Moreover, the first electrode 11 is connected to the TFTs 7 via contact holes formed in the interlayer insulating film 9.

The edge cover 10 has openings, through which the first electrode 11 is exposed, and these portions substantially form light emitting regions of the organic EL element 4. As described above, the organic EL display device 1 of this embodiment is configured to perform full-color display by emitting light of any color of RGB. The organic EL display device 1 of this embodiment is an active matrix type display device having TFTs (thin film transistors) 7.

As illustrated in FIG. 1, an organic EL layer 12 and a second electrode 13 are formed on the first electrode 11. The first electrode 11, the organic EL layer 12, and the second electrode 13 constitute the organic EL element 4. The organic EL element 4 is, e.g., a light emitting element that is driven by low voltage direct current and can emit high-intensity light. The organic EL element 4 includes the first electrode 11, the organic EL layer 12, and the second electrode 13.

Specifically, when the first electrode 11 is a positive electrode, a hole injection layer, a hole transport layer, a light emitting layer, an electron transport layer, an electron injection layer, etc. (not illustrated) are formed in this order on the first electrode 11 as the organic EL layer 12, on top of which the second electrode (negative electrode) 13 is formed. In addition to the above description, a single layer may have two or more functions such as a hole injection and transport layer. Moreover, a carrier blocking layer, etc., may be appropriately inserted into the organic EL layer 12.

On the other hand, when the second electrode 13 is a positive electrode, the order in which the layers are stacked as the organic EL layer 12 is reversed.

Further, in the organic EL display device 1 of this embodiment, the organic EL element 4 is a top emission type that emits light from the opposite side of the base 2, i.e., from the sealing layer 14 side. Specifically, in the organic EL element 4, the first electrode 11 is a reflecting electrode, the second electrode 13 is a permeable electrode or a semi-permeable electrode, and thus the organic EL display device 1 of this embodiment emits light from the sealing layer 14 side. In other words, in the top emission type organic EL display device 1, the surface of the first electrode 11 on the sealing layer 14 side is substantially a light emitting surface of the organic EL element 4 to emit light to the outside.

In the organic EL display device 1 of this embodiment, the organic EL element 4 is sealed by the sealing layer 14, as described above. The sealing layer 14 prevents moisture or oxygen from permeating (entering) the element from the outside, thereby preventing the degradation of the organic EL element 4.

The sealing layer 14 is formed of a plurality of sealing films (e.g., three sealing films). As exemplified in FIG. 1, the sealing layer 14 has a layered structure composed of a first inorganic film 14a provided on the organic EL element 4, an organic film 14b provided on the first inorganic film 14a, and a second inorganic film 14c provided on the organic film 14b.

The first and second inorganic films 14a and 14c are made of e.g., silicon nitride, silicon oxide, silicon oxynitride, or aluminum oxide. The organic film 14b is made of e.g., organic silicon (organosilicon) such as polysiloxane or silicon oxycarbide, acrylate, polyurea, parylene, polyimide, or polyamide. The first and second inorganic films 14a and 14c and the organic film 14b are formed using, e.g., a mask of the same size, so that their external forms coincide with each other.

In the organic EL display device 1 of this embodiment, since the first inorganic film 14a is provided on the organic EL element 4, the first inorganic film 14a can prevent adverse effects of moisture to the organic EL element 4 more reliably. Further, since the organic film 14b is provided on the first inorganic film 14a, the organic film 14b can cover the stress relaxation of the first inorganic film 14a or damages in the first inorganic film 14a such as pinholes or defects by foreign matters, and thus prevents the degradation of the sealing property of the sealing layer 14 more reliably.

Here, the pixel region PA of the organic EL display device 1 of this embodiment will be described specifically with reference to FIG. 2.

Figure 2:
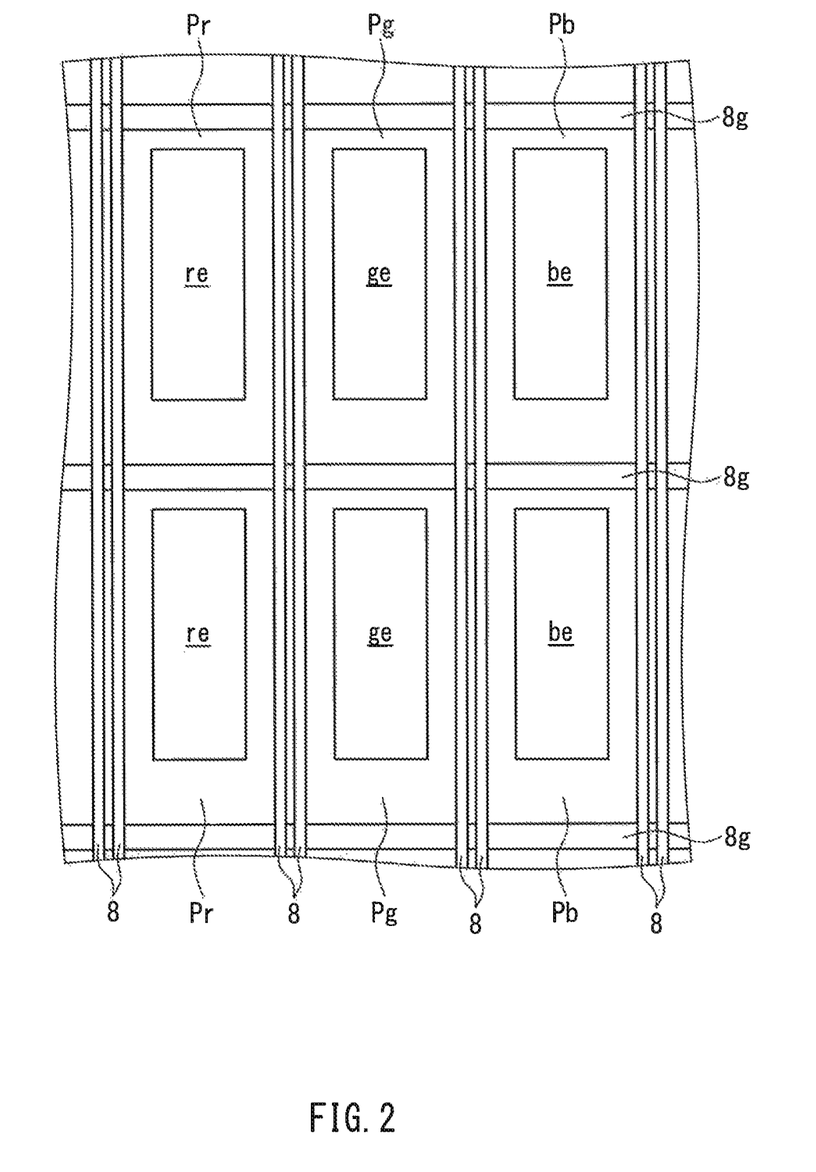
FIG. 2 is an enlarged plan view illustrating the pixel configuration of the organic EL display device.

FIG. 2 is an enlarged plan view illustrating the pixel configuration of the organic EL display device.

As illustrated in FIG. 2, in the organic EL display device 1 of this embodiment, the pixel region PA (FIG. 1) includes a red sub-pixel Pr, a green sub-pixel Pg, and a blue sub-pixel Pb (hereinafter, also referred to as sub-pixels P collectively) that are arranged in a matrix and that emit red (R) light, green (G) light, and blue (B) light, respectively. Each of the sub-pixels P is partitioned by the two lines 8 and a gate line 8g that is connected to the gate of the TFT 7. The size of the pixel region of each of the sub-pixels P in the horizontal direction of FIG. 2 is a size between a center line of two adjacent lines 8 and a center line of another two adjacent lines 8 that are positioned next to the two adjacent lines 8 in the horizontal direction of FIG. 2. The size thereof in the vertical direction of FIG. 2 is a size between centers of two gate lines 8g next to each other. In each of the sub-pixels P an area of the pixel region is defined by the size in the horizontal direction and the size in the vertical direction of FIG. 2.

In the pixel region PA, a set of the red sub-pixel Pr, the green sub-pixel Pg, and the blue sub-pixel Pb constitutes one pixel.

In the red sub-pixel Pr, a portion of the edge cover 10 that is exposed from an opening re substantially forms a light emitting region of the red sub-pixel Pr. Similarly, in the green sub-pixel Pg, a portion of the edge cover 10 that is exposed from an opening ge substantially forms a light emitting region of the green sub-pixel Pg. In the blue sub-pixel Pb, a portion of the edge cover 10 that is exposed from an opening be substantially forms a light emitting region of the blue sub-pixel Pb.

Referring back to FIG. 1, the organic EL display device 1 of this embodiment includes an adjustment layer 15 for adjusting a neutral surface (indicated by "C" in FIG. 1) of the organic EL display device 1. Specifically, as illustrated in FIG. 1, the adjustment layer 15 is directly and closely in contact with a lower surface of the base 2 (the surface of the base 2 opposite to the surface on which the underlying film 6 is provided) to cover the surface of the base 2.

The adjustment layer 15 is provided on the organic EL element 4 side relative to the center (indicated by "M" in FIG. 1) of the whole organic EL display device 1 in the film thickness direction (indicated by "T" in FIG. 1). With this configuration, the adjustment layer 15 can appropriately adjust the neutral surface C when the organic EL display device 1 is bent repeatedly, thereby avoiding damages of the organic EL display device 1.

The adjustment layer 15 has heat dissipating properties and dissipates heat from the organic EL element 4 to the outside (detailed later).

In the organic EL display device 1 of this embodiment, a touch panel 17 is attached on the upper side of the sealing layer 14 via a first adhesion layer 16. In other words, the touch panel 17 is provided above the light emitting surface of the organic EL element 4 to detect the user's touch on letters or figures displayed on the pixel region PA, thereby inputting instructions from the user. A polarizing plate 19 is fixed above the touch panel 17 via a second adhesion layer 18 to enhance the display quality of the pixel region PA.

The first adhesion layer 16 also has a function of planarizing the surface of the sealing layer 14 by filling the unevenness on the surface of the sealing layer 14. For example, by applying a low-viscosity, ultraviolet-curable coating liquid (the first adhesion layer 16) to the surface of the sealing layer 14 by screen printing or the like, uneven surface is planarized. The applied first adhesion layer 16 is cured by ultraviolet light after the touch panel 17 is adhered to the first adhesion layer 16.

The first adhesion layer 16 also can have a drying function or a deoxidation function by mixing of a desiccant or an oxygen absorber. By doing so, it is possible to prevent moisture or oxygen having entered from the outside from reaching the organic EL element 4 and damaging the organic EL element 4. In other words, the first adhesion layer 16 can enhance the sealing properties of the organic EL element 4.

Hereinafter, the functions of the adjustment layer 15 will be described specifically with reference to FIGS. 3 and 4.

Figure 3:
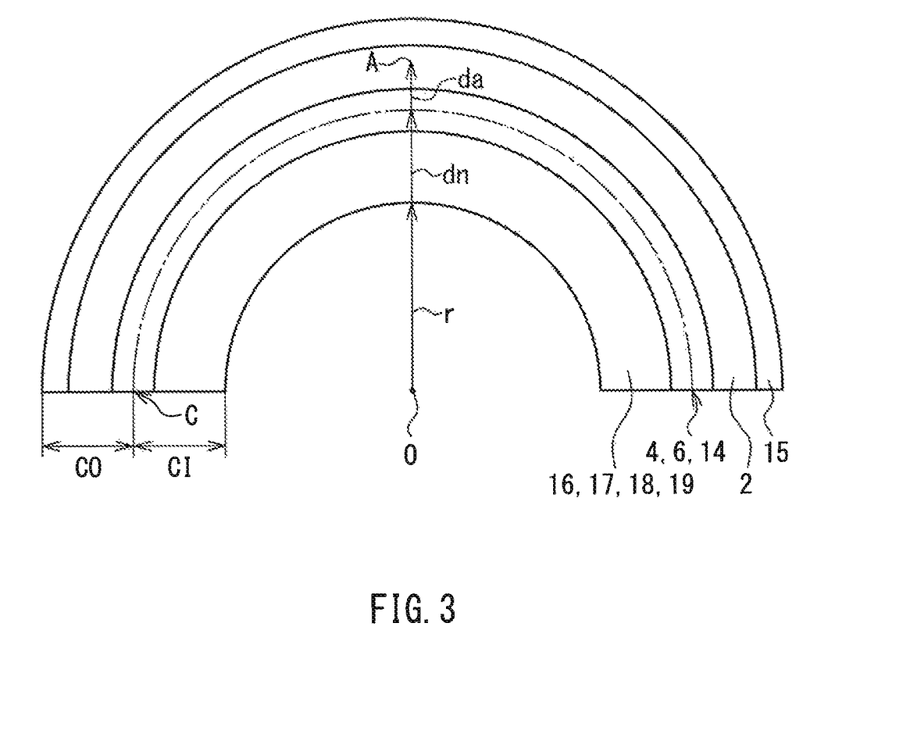
FIG. 3 is a view for explaining a method for adjusting a neutral surface by means of an adjustment layer illustrated in FIG. 1.

FIG. 3 is a view for explaining a method for adjusting the neutral surface by means of the adjustment layer illustrated in FIG. 1. FIG. 4 is a view for explaining heat dissipation from the adjustment layer. In FIG. 4, the underlying film 6 is not illustrated (the same applies to FIG. 8 described later).

First, the specific method for adjusting the neutral surface C by means of the adjustment layer 15 will be described with reference to FIG. 3.

In FIG. 3, the Young's modulus and the thickness of the adjustment layer 15 are adjusted so that the neutral surface C of the organic EL display device 1 is located in the vicinity of the sealing layer 14, i.e., in the vicinity where film breakage tends to occur due to strain (elongation) when the organic EL display device 1 is bent.

The neutral surface C of the organic EL display device 1 is a location where no strain is generated when the organic EL display device 1 is bent. Specifically, as illustrated in FIG. 3, when the organic EL display device 1 is bent relative to a bending center O with a bending radius r, with the organic EL element 4 inside, the neutral surface C of the organic EL display device 1 is formed at a location indicated by a dashed line in FIG. 3 in accordance with the Young's moduli and the film thicknesses of the respective layers of the organic EL display device 1. The neutral surface C does not undergo any tensile stress or compressive stress due to bending, and the strain (elongation) is zero.

In a region of the organic EL display device 1 positioned outward of the neutral surface C (a region indicated by "CO" in FIG. 3), each layer undergoes tensile stress and thus elongates in the bending direction in accordance with the Young's modulus of each layer.

Meanwhile, in a region of the organic EL display device 1 positioned inward of the neutral surface C (a region indicated by "CI" in FIG. 3), each layer undergoes compressive stress and thus is compressed in the bending direction in accordance with the Young's modulus of each layer.

In the organic EL display device 1, a region where the organic EL element 4 including the TFTs 7 and the lines 8, the sealing layer 14, the underlying film 6, and the moisture barrier layer are provided is a region where film breakage is particularly likely to occur when the organic EL display device 1 is bent. The breakage of any film of the organic EL element 4, the sealing layer 14, the underlying film 6, and the moisture barrier layer included in this region may result in abnormalities in the operation or characteristics of the organic EL display device 1, or permeation of moisture or oxygen.

The organic EL element 4, the sealing layer 14, the underlying film 6, and the moisture barrier layer included in this region (hereinafter, termed "functional layer") have a thickness of about 10 μm in the film thickness direction T. It is necessary to design the organic EL display device 1 so that the neutral surface C is located near the functional layer. Specifically, it is required to control (adjust) the neutral surface C so that the maximum strain rate in the functional layer will be 1% or less.

The strain rate Hr is calculated from the formula (1) below using the bending radius r, where dn represents a distance from the inner surface to the neutral surface C, and da represents a distance from the neutral surface C to a given point A as illustrated in FIG. 3.

$$Hr = da + (r + dn) \quad (1)$$

In the organic EL display device 1 of this embodiment, the maximum strain rate in the functional layer is adjusted to be 1% or less by providing the adjustment layer 15. Specifically, in the organic EL display device 1 of this embodiment, since the touch panel 17 and the like are provided opposite to the organic EL element 4, the neutral surface C shifts toward the touch panel 17 side. Therefore, in the organic EL display device 1 of this embodiment, by providing the adjustment layer 15, the neutral surface C is adjusted to be located in the vicinity of the functional layer, so that the maximum strain rate in the functional layer is controlled to be 1% or less.

Next, the method for calculating the neutral surface C will be described in detail. Four layers having the same width are laminated in the depth direction as illustrated in FIG. 3, and in this state, $E_i$ represents the Young's modulus of each layer, $t_i$ represents the thickness, and $h_i$ represents the distance of each interface from the inner surface. For example, the Young's modulus and the thickness of the innermost layer are expressed as $E_1$ and $t_1 = h_1$, respectively, and the Young's modulus and the thickness of the 2nd layer from the inner side are expressed as $E_2$ and $t_2 = h_2 - h_1$, respectively.

In this state, the distance do from the inner surface to the neutral surface C is expressed by the formula (2) below.

$$dn = \Sigma\{E_i \times t_i \times (h_i + h_{i-1})\} \div \Sigma(2 \times E_i \times t_i) \quad (2)$$

In this embodiment, since four layers are laminated as illustrated in FIG. 3, $\Sigma$ is the sum of a sequence i=1 to 4. When the lamination is composed of n layers, the sequence is the sum of n. As is clear from the formula (2), the location of the neutral surface C can be controlled by introducing a layer having a certain Young's modulus and thickness. Moreover, the $(h_i + h_{i-1})$ of the formula (2) being divided by two means the central position of the i-th layer. The formula (2) also means that the location of the neutral surface C is determined by weighting the Young's modulus×the thickness of each layer ($E_i \times t_i$) with the central position of the layer. Therefore, in the layered structure such as that illustrated in FIG. 3, the layer closer to the surface has a higher ability of controlling the location of the neutral surface C, and the adjustment layer 15 can adjust the neutral surface C.

Specifically, the base 2, the functional layer, the adjustment layer 15, the first adhesion layer 16, the touch panel 17, the second adhesion layer 18, and the polarizing plate 19 respectively have a thickness in the film thickness direction T of, e.g., 12 µm, 10 µm, 100 µm, 10 µm, 30 µm, 10 µm, and 130 µm. Further, the base 2, the functional layer, the adjustment layer 15, the first adhesion layer 16, the touch panel 17, the second adhesion layer 18, and the polarizing plate 19 respectively have a Young's modulus in the film thickness direction T of e.g., 7 GPa, 48 GPa, 10 GPa, 3 GPa, 6 GPa, 3 GPa, and 6 GPa. Since the functional layer includes the sealing layer 14 composed of inorganic films, the underlying film 6, and the moisture barrier layer, the thickness and the Young's modulus are high.

The location dn of the neutral surface C is calculated from the formula (2) using the thickness and the Young's modulus of each layer, and dn=129 µm is obtained. The location da of the functional layer in the formula (2) is 17 µm on the bottom surface side (center side of the bending) and 7 µm on the top surface side. The strain rate Hr of the functional layer is calculated from the formula (1). As is clear from the formula (1), it is necessary to set the curvature radius r to be a predetermined value or more to control the strain rate to be a predetermined value or less. Specifically, a case is considered in which the strain rate of the functional layer of 1% or less is required. The curvature radius r at which the strain rate of the functional layer on the bottom surface side becomes 1% or less is 1600 µm or more. The curvature radius r at which the strain rate of the functional layer on the top surface side becomes 1% or less is 600 µm or more. From these, collectively, it is determined that the curvature radius r needs to be 1600 µm or more. In this manner, a possible curvature radius is determined depending on the setting of the location of the neutral surface C. In other words, by controlling the location of the neutral surface C, an organic EL display device 1 having a smaller curvature radius can be realized.

In the above description, the organic EL display device 1 is bent with the organic EL element 4 positioned inside. Even when the organic EL display device 1 is bent with the organic EL element 4 positioned outside, the strain rate Hr will be the same, and the adjustment layer 15 can exhibit the function of adjusting the neutral surface C in the same manner.

Next, the heat dissipating function of the adjustment layer 15 will be described specifically with reference to FIG. 4.

Figure 4:
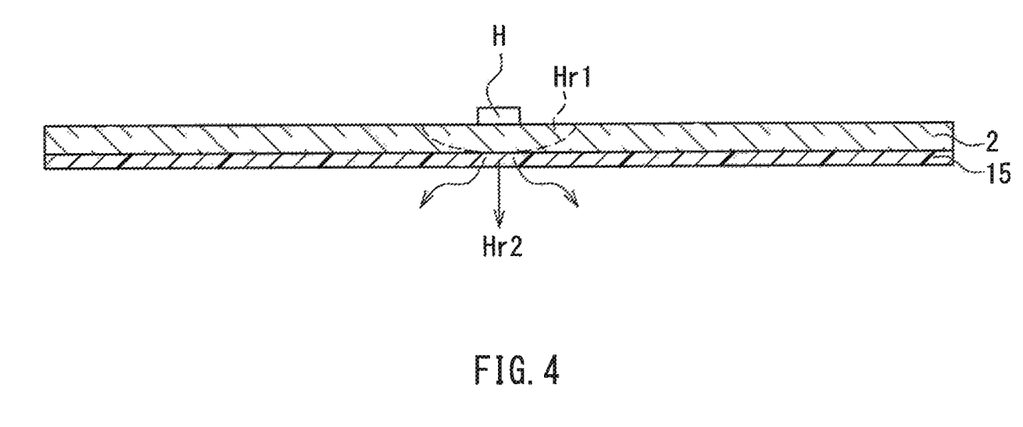
FIG. 4 is a view for explaining heat dissipation from the adjustment layer.

As exemplified in FIG. 4, in the organic EL display device 1, each pixel in the organic EL element 4 becomes a heat source H. In the organic EL display device 1 of this embodiment, heat from the heat source H is diffused inside the base 2 as indicated by "Hr1" in FIG. 4. Then, the diffused heat is dissipated to the outside by the heat dissipating properties of the adjustment layer 15 as indicated by "Hr2" in FIG. 4. As a result, in the organic EL display device 1 of this embodiment, it is possible to prevent the heat from the organic EL element 4 from accumulating inside the device.

The adjustment layer 15 is made of a carbon material such as graphite, graphene, carbon nanohorns, carbon nanofibers or carbon nanotubes, or a material in which the carbon material is dispersed in an organic resin. For example, the adjustment layer 15 is formed on the surface of the base 2 by applying the carbon material via screen printing, a slit coater, or the like.

Further, a material having a heat conductivity within a range from 0.15 to 20 W/m·K is used for the adjustment layer 15.

In the organic EL display device 1 of this embodiment, since the neutral surface C is adjusted using the adjustment layer 15 as described above, the base 2 can be thin as compared with the case of not using the adjustment layer 15. As a result, the organic EL display device 1 of this embodiment can greatly reduce the accumulation of heat inside the base 2, in combination with the heat dissipating properties of the adjustment layer 15.

In the organic EL display device 1 of this embodiment configured as above, the adjustment layer 15 is provided to adjust the neutral surface C of the organic EL display device 1. The adjustment layer 15 has heat dissipating properties, and is provided on the organic EL element 4 side relative to the center M of the whole organic EL display device 1 in the film thickness direction T. With this configuration, unlike the above conventional example, the organic EL display device 1 of this embodiment can prevent the heat from the organic EL element 4 from accumulating inside the device while avoiding damages due to repetitive bending.

Moreover, in this embodiment, the adjustment layer 15 has a heat conductivity within a range from 0.15 to 20

W/m·K. By doing so, in this embodiment, the adjustment layer 15 can dissipate heat from the organic EL element 4 reliably and efficiently.

Moreover, in this embodiment, a carbon material or a material in which a carbon material is dispersed in an organic resin is used for the adjustment layer 15. By doing so, in this embodiment, the adjustment layer 15 is made of a material having a high Young's modulus. Thus, the thickness of the adjustment layer 15 is reduced, and the thickness of the organic EL display device 1 is reduced easily.

Moreover, in this embodiment, the carbon material of the adjustment layer 15 is graphite, graphene, carbon nanohorns, carbon nanofibers, or carbon nanotubes. By doing so, in this embodiment, a material having high heat conductivity is used for the adjustment layer 15. Thus, the adjustment layer 15 can dissipate heat from the organic EL element 4 more efficiently.

Moreover, in this embodiment, the organic EL display device 1 further includes the touch panel 17, wherein the adjustment layer 15 and the touch panel 17 are provided so that the base 2 is interposed therebetween. By doing so, in this embodiment, it is possible to easily configure an organic EL display device 1 with a touch panel 17 having excellent bendability and heat dissipating properties.

Moreover, in this embodiment, since the adjustment layer 15 is in close contact with the base 2, heat from the organic EL element 4 is directly diffused from the base 2 to the adjustment layer 15, thereby being dissipated more efficiently.

Moreover, in this embodiment, the organic EL element 4 emits light from the opposite side of the base 2. By doing so, in this embodiment, it is possible to configure a top emission type organic EL display device 1 having excellent bendability and heat dissipating properties.

Embodiment 2

Figure 5:
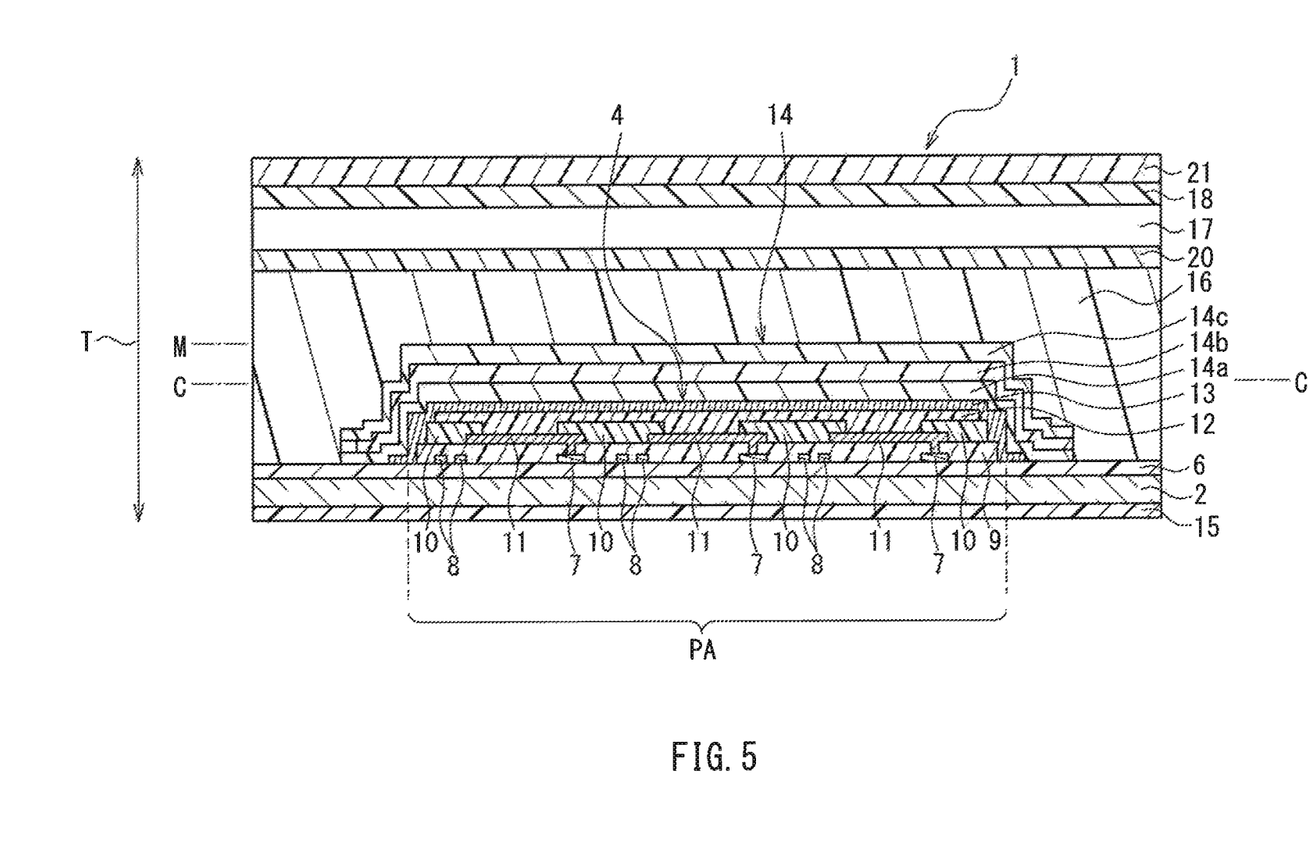
FIG. 5 is a cross-sectional view illustrating the cross section of an organic EL display device according to Embodiment 2 of the present invention.

FIG. 5 is a cross-sectional view illustrating the cross section of an organic EL display device according to Embodiment 2 of the present invention.

In FIG. 5, this embodiment mainly differs from Embodiment 1 in that the organic EL display device includes a color filter. The same components as those of Embodiment 1 are denoted by the same reference numerals, and the explanation will not be repeated.

As illustrated in FIG. 5, in the organic EL display device 1 of this embodiment, a color filter 20 is provided between the first adhesion layer 16 and the touch panel 17. In the color filter 20, filters of corresponding colors are arranged above the sub-pixels P of R, G and B (not illustrated). In the organic EL display device 1 of this embodiment, unlike the organic EL display device 1 of Embodiment 1, the sub-pixels P emit white light, and the white light emitted from the sub-pixels P passes through the color filter 20 to emit light of corresponding colors to the outside.

In other words, the color filter 20 absorbs white light emitted from the organic EL element 4 appropriately and converts the light to emission light of R, G and B. The color filter 20 contains a black matrix (BM) to prevent unnecessary reflection of external light. The total film thickness and the average Young's modulus of the color filter 20 including R, G, B and BM are, e.g., 3 μm and 3 GPa, respectively.

In addition to the above description, the color filter 20 also can be applied to a case in which the sub-pixels P of R, G and B respectively emit light of R, G and B as the sub-pixels P of Embodiment 1. In this case, the color filter 20 can improve light emission properties such as light emission quality of the sub-pixels P of R, G and B.

Moreover, in the organic EL display device 1 of this embodiment, unlike the organic EL display device 1 of Embodiment 1, a protective film 21 is formed in place of the polarizing plate 19. The protective film 21 may include a hard coat layer to impart scratch resistance to the surface exposed to the outside, or an antifouling layer to improve fingerprint resistance. Such a hard coat layer or antifouling layer may be formed directly on the touch panel 17 as long as functions such as the scratch resistance and fingerprint resistance are not impaired. In this case, the protective film 21 is omitted.

As described above, since the organic EL display device 1 of this embodiment includes the color filter 20, heat is also generated in the color filter 20. Specifically, to covert white light to red color via the color filter 20 for example, the color filter 20 absorbs light other than red color from the white light and generates heat. Further, since the polarizing plate 19 is not provided, the color filter 20 also absorbs external light and generates heat.

However, in the organic EL display device 1 of this embodiment, since the adjustment layer 15 is provided as in the organic EL display device 1 of Embodiment 1, heat generated at the color filter 20 can be dissipated to the outside.

With the above configuration, this embodiment can have the same effects as those of Embodiment 1.

Embodiment 3

Figure 6:
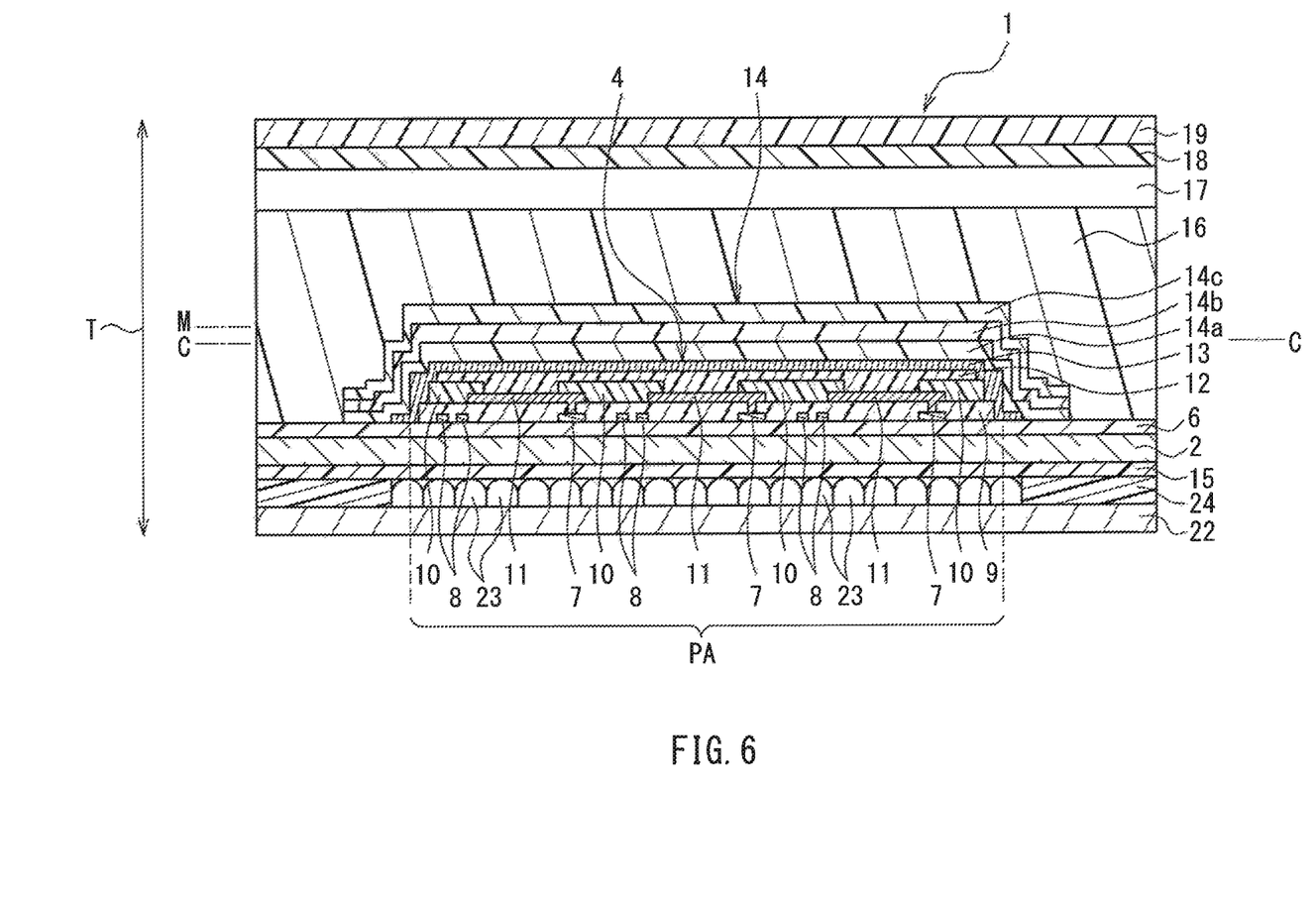
FIG. 6 is a cross-sectional view illustrating the cross section of an organic EL display device according to Embodiment 3 of the present invention.
Figure 7:
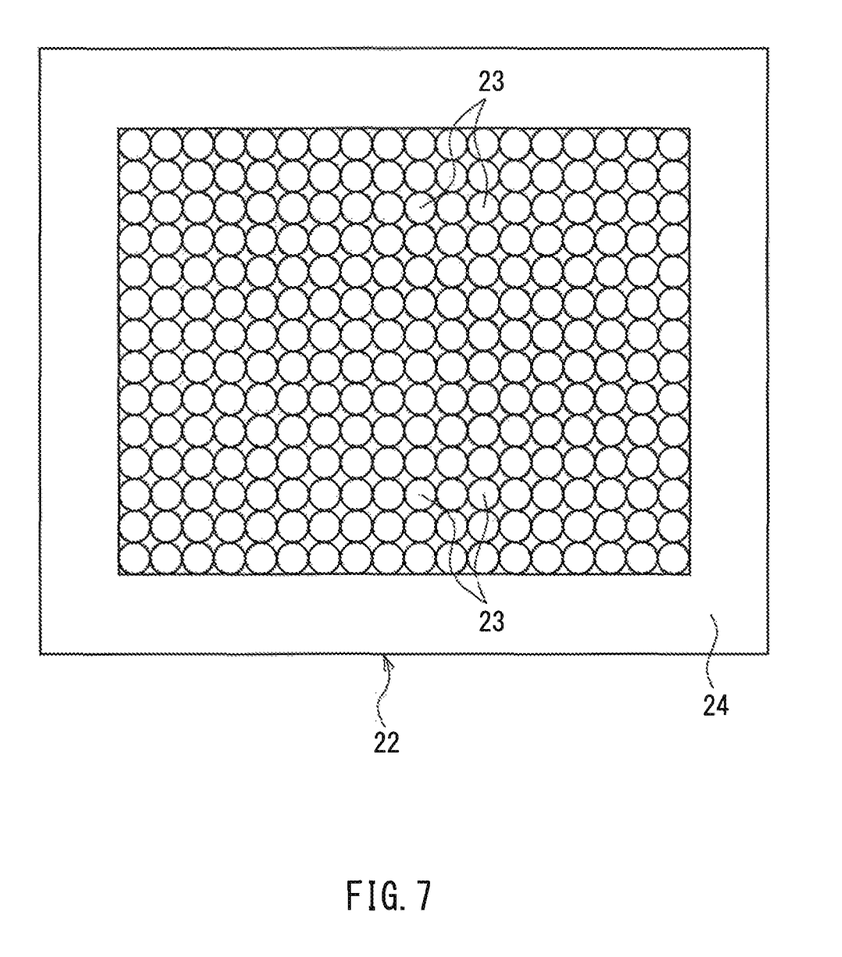
FIG. 7 is a plan view illustrating the configuration of a holding plate, supporters, and an adhesion layer illustrated in FIG. 6.
Figure 8:
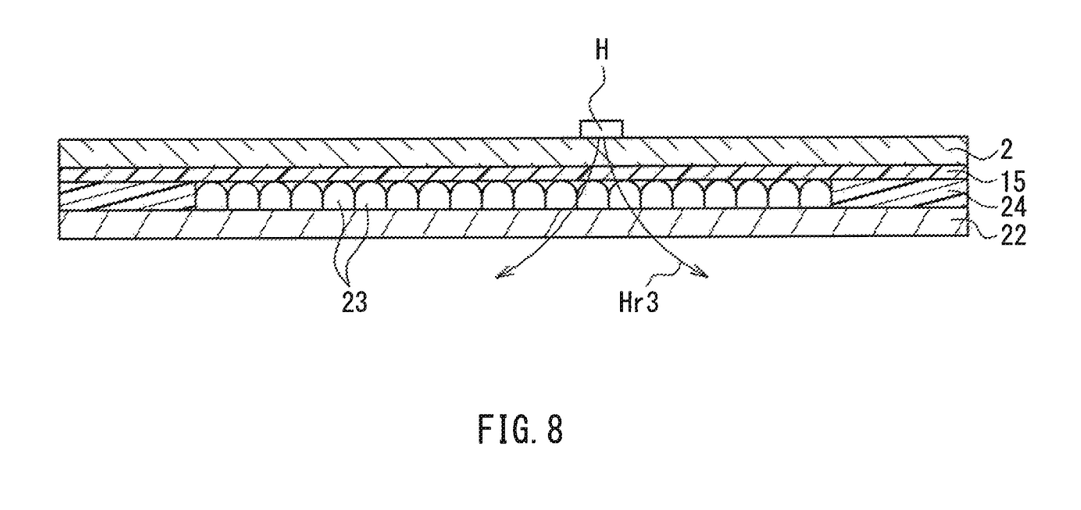
FIG. 8 is a view for explaining heat dissipation from the adjustment layer, the supporters, and the holding plate illustrated in FIG. 6.

FIG. 6 is a cross-sectional view illustrating the cross section of an organic EL display device according to Embodiment 3 of the present invention. FIG. 7 is a plan view illustrating the configuration of a holding plate, supporters, and an adhesion layer illustrated in FIG. 6. FIG. 8 is a view for explaining heat dissipation from the adjustment layer, the supporters, and the holding plate illustrated in FIG. 6.

In the drawings, this embodiment mainly differs from Embodiment 1 in that the organic EL display device 1 of this embodiment includes a plurality of supporters that can make point contact with the adjustment layer, and a holding plate that holds the supporters. The same components as those of Embodiment 1 are denoted by the same reference numerals, and the explanation will not be repeated.

As illustrated in FIG. 6, the organic EL display device 1 of this embodiment includes, under the adjustment layer 15, a holding plate 22, and a plurality of supporters 23 and a third adhesion layer 24 between the holding plate 22 and the adjustment layer 15. One end of each supporter 23 on the adjustment layer 15 side is semicircular in cross section, and these supporters 23 can make point contact with the adjustment layer 15.

Further, as illustrated in FIG. 7, the supporters 23 are movably held on the holding plate 22 inside of the frame-shaped third adhesion layer 24. Specifically, the supporters 23 are movably held in a space between the adjustment layer 15, the holding plate 22, and the third adhesion layer 24. When the organic EL display device 1 is bent, the supporters 23 appropriately make point contact with the adjustment layer 15 and slide on the surface of the adjustment layer 15.

Further, since the holding plate 22 is attached to the adjustment layer 15 by the third adhesion layer 24 that is provided in the periphery of the organic EL display device 1, it is possible to minimize the shift of the location of the neutral surface C of the organic EL display device 1.

Moreover, the holding plate 22 and the supporters 23 are made of a material having high heat conductivity such as metal or carbon black. Specifically, the holding plate 22 and the supporters 23 each have a heat conductivity within a range from 10 to 250 W/m·K. By doing so, in the organic EL display device 1 of this embodiment, heat from the organic EL element 4 can be dissipated to the outside via the supporters 23 and the holding plate 22.

Specifically, in the organic EL display device 1 of this embodiment, as indicated by "Hr3" in FIG. 8, heat from the heat source H is diffused inside the base 2. Then, the diffused heat is dissipated to the outside by the heat dissipating properties of the adjustment layer 15, the supporters 23, and the holding plate 22. As a result, in the organic EL display device 1 of this embodiment, it is possible to prevent heat from the organic EL element 4 from accumulating inside the device.

In addition to the above description, the shape of the supporters 23 may be, e.g., spherical.

With the above configuration, this embodiment can have the same effects as those of Embodiment 1.

Moreover, in this embodiment, the organic EL display device 1 includes a plurality of the supporters 23 that can make point contact with the adjustment layer 15, and the holding plate 22 that holds the supporters 23. Thereby, in this embodiment, it is possible to improve the bendability of the organic EL display device 1.

Moreover, in this embodiment, the holding plate 22 and the supporters 23 each have a heat conductivity within a range from 10 to 250 W/m·K. Thereby, the holding plate 22 and the supporters 23 can dissipate heat from the organic EL element 4 reliably and efficiently.

Embodiment 4

Figure 9:
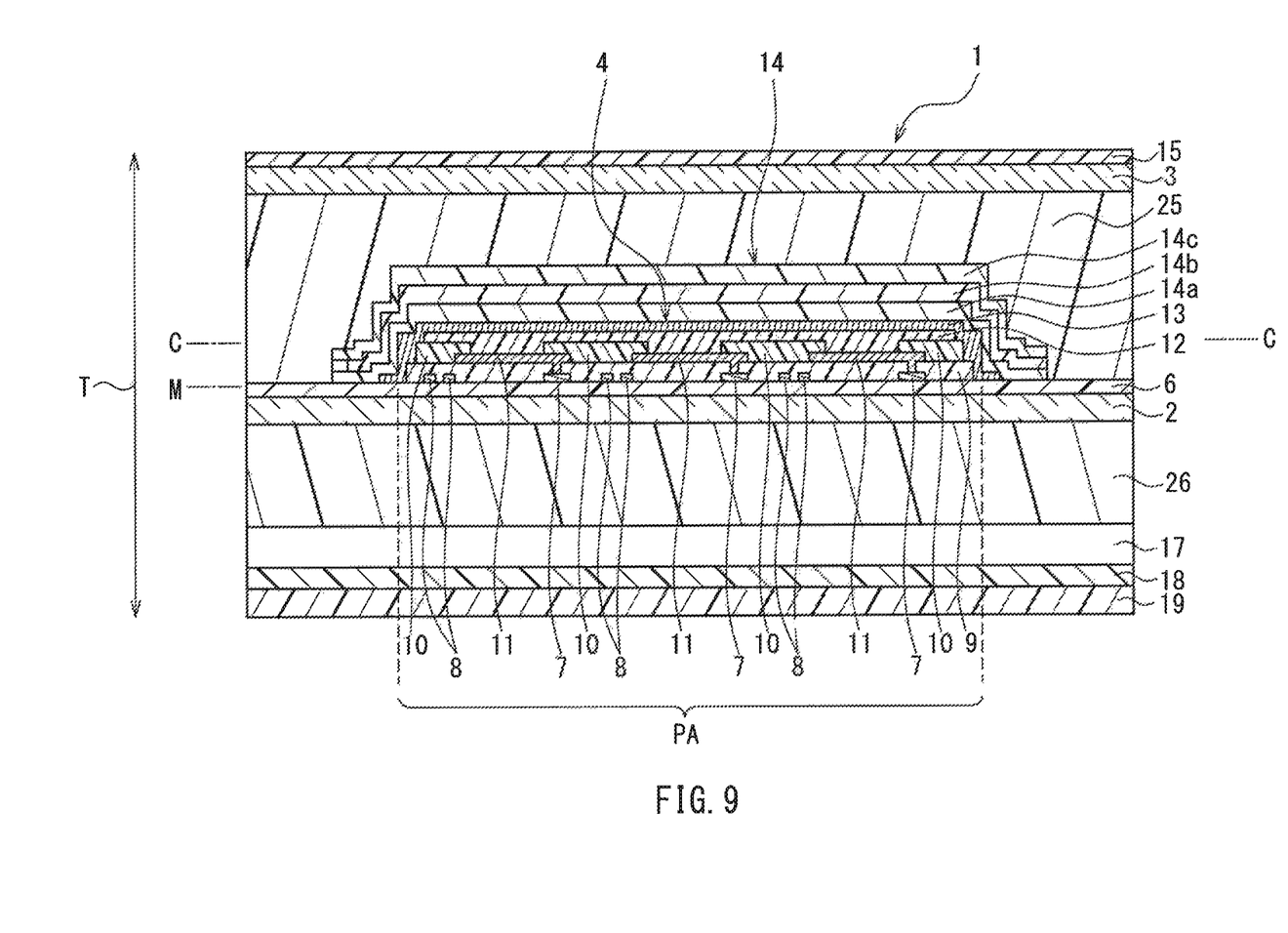
FIG. 9 is a cross-sectional view illustrating the cross section of an organic EL display device according to Embodiment 4 of the present invention.

FIG. 9 is a cross-sectional view illustrating the cross section of an organic EL display device according to Embodiment 4 of the present invention.

In FIG. 9, this embodiment mainly differs from Embodiment 1 in that the organic EL display device is a bottom emission type that emits light from the base side. The same components as those of Embodiment 1 are denoted by the same reference numerals, and the explanation will not be repeated.

As illustrate in FIG. 9, in the organic EL display device 1 of this embodiment, in the organic EL element 4, the first electrode 11 is a permeable electrode or a semi-permeable electrode, the second electrode 13 is a reflecting electrode, whereby the organic EL display device 1 of this embodiment is a bottom emission type that emits light from the base 2 side. In other words, in the bottom emission type organic EL display device 1, the surface of the first electrode 11 on the base 2 side is substantially a light emitting surface of the organic EL element 4 to emit light to the outside.

In the organic EL display device 1 of this embodiment, a fifth adhesion layer 26, the touch panel 17, the second adhesion layer 18, and the polarizing plate 19 are arranged in this order under the base 2. That is, in the organic EL display device 1 of this embodiment, the fifth adhesion layer 26 adheres the touch panel 17 to the base 2.

Moreover, in the organic EL display device 1 of this embodiment, a counter substrate 3 is provided opposed to the base 2. Similarly to the base 2, the counter substrate 3 is made of e.g., a plastic film having flexibility and attached to the underlying film 6 and the sealing layer 14 by a fourth adhesion layer 25. The counter substrate 3 and the base 2 may be made of the same material or different materials.

The fourth adhesion layer 25 may have the planarizing function, the drying function, and the deoxidation function possessed by the first adhesion layer 16 of Embodiment 1. Specifically, the fourth adhesion layer 25 may have a function of planarizing the surface of the sealing layer 14 by filling the unevenness on the surface of the sealing layer 14. For example, by applying a low-viscosity, ultraviolet-curable coating liquid (the fourth adhesion layer 25) to the surface of the sealing layer 14 by screen printing or the like, uneven surface is planarized. The applied fourth adhesion layer 25 may be cured by ultraviolet light after the counter substrate 3 is adhered to the fourth adhesion layer 25.

The fourth adhesion layer 25 also can have a drying function or a deoxidation function by mixing of a desiccant or an oxygen absorber. By doing so, it is possible to prevent moisture or oxygen having entered from the outside from reaching the organic EL element 4 and damaging the organic EL element 4. In other words, the fourth adhesion layer 25 can enhance the sealing properties of the organic EL element 4.

Moreover, in the organic EL display device 1 of this embodiment, the adjustment layer 15 is directly and closely in contact with the surface of the counter substrate 3. Similarly to the adjustment layer 15 of Embodiment 1, the adjustment layer 15 is provided on the organic EL element 4 side relative to the center M of the whole organic EL display device 1 in the film thickness direction T. With this configuration, the adjustment layer 15 can appropriately adjust the neutral surface when the organic EL display device 1 is bent repeatedly, thereby avoiding damages of the organic EL display device 1.

With the above configuration, this embodiment can have the same effects as those of Embodiment 1.

In this embodiment, since the organic EL display device 1 includes the counter substrate 3 provided opposed to the base 2, the organic EL display device 1 can be strengthened, and the sealing properties of the organic EL element 4 can be enhanced easily.

Moreover, in this embodiment, since the adjustment layer 15 is in close contact with the counter substrate 3, the bendability of the organic EL display device 1 can be improved easily while improving the strength of the organic EL display device 1 and the sealing properties of the organic EL element 4.

Moreover, in this embodiment, the organic EL element 4 emits light from the base 2 side. By doing so, in this embodiment, it is possible to configure a bottom emission type organic EL display device 1 having excellent bendability and heat dissipating properties.

The above embodiments are all illustrative and not restrictive. The technical scope of the present invention is defined by the appended claims, and all changes that come within the range of equivalency of the claims are intended to be embraced therein.

For example, in the above description, the electroluminescent element is an organic EL element. However, the present invention is not limited thereto, and the electroluminescent element may be, e.g., an inorganic EL element including an inorganic compound.

In the above description, the organic EL display device includes a touch panel. However, the present invention is not limited thereto, and may be applied to, e.g., display devices without a touch panel, or illumination devices such as a backlight device.

In the above description, the sealing layer is composed of an organic film and two inorganic films. However, the sealing layer of the present invention is not limited thereto.

From the viewpoint of easily enhancing the sealing property with respect to the electroluminescent element, it is preferred that the sealing layer has a layered structure composed of an organic film and an inorganic film as the sealing layers of the above embodiments. Alternatively, the electroluminescent element may be sealed by providing a frame-shaped sealing material so as to surround the electroluminescent element and also using a sealing material and a filler.

In the above description, the present invention is applied to the active matrix type organic EL display device having TFTs (thin film transistors). However, the present invention is not limited thereto, and may be applied to, e.g., a passive matrix type organic EL display device without thin film transistors.

In addition to the above description, Embodiments 1 to 4 may be combined as appropriate.

INDUSTRIAL APPLICABILITY

The present invention is useful for an electroluminescent device that can prevent heat from an electroluminescent element from accumulating inside the device while avoiding damages due to repetitive bending.

DESCRIPTION OF REFERENCE NUMERALS 1 organic EL display device
2 base
3 counter substrate
4 organic EL element (electroluminescent element)
15 adjustment layer
17 touch panel
22 holding plate
23 supporters

The invention claimed is:

1. An electroluminescent device comprising:
a flexible base;
a functional layer including an electroluminescent element provided on the base; and
an adjustment layer that has heat dissipating properties and that adjusts a neutral surface of the electroluminescent device,
wherein the adjustment layer is provided on an electroluminescent element side relative to a center of the electroluminescent device in a film thickness direction and adjusts a maximum strain in the functional layer to 1% or less.

2. The electroluminescent device according to claim 1, wherein the adjustment layer has a heat conductivity within a range from 0.15 to 20 Wm·K.

3. The electroluminescent device according to claim 1, wherein the adjustment layer is made of a carbon material, or a material in which a carbon material is dispersed in an organic resin.

4. The electroluminescent device according to claim 3, wherein the carbon material of the adjustment layer is graphite, graphene, carbon nanohorns, carbon nanofibers, or carbon nanotubes.

5. The electroluminescent device according to claim 1, further comprising a touch panel,
wherein the adjustment layer and the touch panel are provided so that the base is interposed therebetween.

6. The electroluminescent device according to claim 1, further comprising a counter substrate provided opposed to the base.

7. The electroluminescent device according to claim 6, wherein the adjustment layer is in close contact with the counter substrate.

8. The electroluminescent device according to claim 1, wherein the adjustment layer is in close contact with the base.

9. The electroluminescent device according to claim 1, further comprising
a plurality of supporters that make point contact with the adjustment layer; and
a holding plate that holds the plurality of supporters.

10. The electroluminescent device according to claim 9, wherein the supporters and the holding plate each have a heat conductivity within a range from 10 to 250 W/m·K.

11. The electroluminescent device according to claim 1, wherein the electroluminescent element emits light from an opposite side of the base.

12. The electroluminescent device according to claim 1, wherein the electroluminescent element emits light from a base side.

* * * * *